United States Patent
Krug

Patent Number: 5,395,647
Date of Patent: Mar. 7, 1995

[54] APPARATUS AND METHOD FOR COOLING FILMS COATED IN A VACUUM

[75] Inventor: Thomas Krug, Rodenbach, Germany

[73] Assignee: Leybold Aktiengesellschaft, Hanau, Germany

[21] Appl. No.: 55,847

[22] Filed: Apr. 30, 1993

[30] Foreign Application Priority Data

Jul. 4, 1992 [DE] Germany .............................. 4 222 013

[51] Int. Cl.⁶ .............................................. C23C 16/00
[52] U.S. Cl. .................................. 427/172; 427/255.5; 427/251; 427/294; 427/296; 427/398.1; 427/398.2; 427/398.3; 118/715; 118/724; 118/50
[58] Field of Search ................. 118/50, 718, 719, 724, 118/726, 730, 733, 725; 427/255.5, 251, 177, 398.1, 398.3, 294, 296, 172, 251, 398.2; 204/298.24

[56] References Cited

U.S. PATENT DOCUMENTS

| | | | |
|---|---|---|---|
| 3,414,048 | 12/1968 | Rall | 165/1 |
| 4,451,501 | 5/1984 | Nagao et al. | 427/531 |
| 4,655,167 | 4/1987 | Nakamura et al. | 118/718 |
| 4,826,707 | 5/1989 | Schwarz et al. | 427/177 |
| 4,844,009 | 7/1989 | Schwarz et al. | 118/718 |
| 5,076,203 | 12/1991 | Vaidya et al. | 118/718 |
| 5,122,389 | 6/1992 | Yasunaga | 118/726 X |
| 5,140,938 | 8/1992 | Kasanuki et al. | 118/718 |
| 5,188,865 | 2/1993 | Richter et al. | 427/251 X |
| 5,198,032 | 3/1993 | Kleyer et al. | 118/718 |
| 5,254,169 | 10/1993 | Wenk | 118/730 X |
| 5,258,074 | 11/1993 | Okuda et al. | 118/718 |

FOREIGN PATENT DOCUMENTS

| | | |
|---|---|---|
| 0311302 | 9/1988 | European Pat. Off. . |
| 1621343 | 2/1971 | Germany . |
| 968097 | 10/1982 | U.S.S.R. . |

OTHER PUBLICATIONS

Schwartz and Wagner, *Thermal Limitations in Roll Coating Processes*, Society of Vacuum Coaters, 1985.

Primary Examiner—James C. Housel
Assistant Examiner—Long V. Le
Attorney, Agent, or Firm—Felfe & Lynch

[57] ABSTRACT

A wetting unit provides a contact agent between the coating roll and the film surface before coating by a thermal source.

16 Claims, 2 Drawing Sheets

APPARATUS AND METHOD FOR COOLING FILMS COATED IN A VACUUM

BACKGROUND OF THE INVENTION

The invention relates to an apparatus for coating films in a vacuum with metallic or nonmetallic materials. A unit prepares the film for the coating process, and pulley rolls provide close contact between the film and a chilled coating roll during a coating by a source excited by thermalization.

The coating of films, which as a rule have been limited resistance to heat, is performed in common processes with coating sources which are operated preferably by thermalizing the coating material. The technical problem therefore arises that, for the formation of a sufficient coating thickness on the film, the film itself must be exposed to the coating source for a certain minimum amount of time, and hence to the heat source. In this case, however, the film undergoes considerable heating and if the coating time is too long or the coating rate too high it can be thermally destroyed.

Usually the film to be coated is unwound from a parent roll on which the uncoated film is stocked, and brought over various pulley rolls within a coating chamber into contact with a cooled coating roll which keeps the film at the lowest possible temperature while it is being coated.

The cooling effect of the coating roll, however, is very limited, inasmuch as the thermal transfer coefficient between the film and the coating roll is determined by the mechanical contact between the film and the roll. Since the roughness of the roll and of the film permits only an interrupted surface contact, the heat transfer coefficient is about 30 to 50 W/m²k (Watts/m²0,K) which is too low to cool the film during the coating process on account of the high temperatures.

Further studies of the heat flow from the film to the coating roll have shown that, during the coating process, a water vapor cushion forms between the film and the coating roll, which is due to the desorption of the water adsorbed onto the film surface and fills up the microscopic voids that are formed by the roughness between the film and the coating roll. See, in this connection, the article, "Thermal Limitations in Roll Coating Processes," by W. Schwartz and W. Wagner, which appeared in 'Society of Vacuum Coaters,' 1985. The vapor cushion thus forming provides for a thermal transfer sufficient for the coating of the film, with a heat transfer coefficient between 300 and 500 W/m²k.

Heat transfer coefficients of this magnitude require films which have an initially present amount of water adsorbed onto their surface. In some coating processes, for example in two-sided coating, in which during the second coating the back of the film has already been coated, no more moisture is adsorbed onto the film surface due, of course, to the first coating process. Therefore no vapor cushion can form between the film and the coating roll, so that thermal damage can be done to the film.

SUMMARY OF THE INVENTION

According to the invention, the film, regardless of its history, will survive coating adapted to the economic requirement of mass production unharmed by thermal defects on the film surface. The film can be exposed to the coating source for a longer period for the deposit of thicker coatings, without being thermally destroyed thereby. This is accomplished by a wetting unit which introduces a contact agent between the coating roll and the film surface before the coating process.

The invention is based on the idea of coating the film surface directly opposite the coating roll with a thin film of moisture, preferably with water, which within the volume enclosed by the film and the coating roll is converted by the heat from the coating source into a steam cushion and thus provides for a high heat transfer coefficient required for the safe coating of the film.

Of course the same effect is achieved if the film of moisture is applied to the circumference of the coating roll before the film comes in direct contact with the roll.

DETAILED DESCRIPTION OF THE PREFERRED EMBODIMENT

Figure 1:
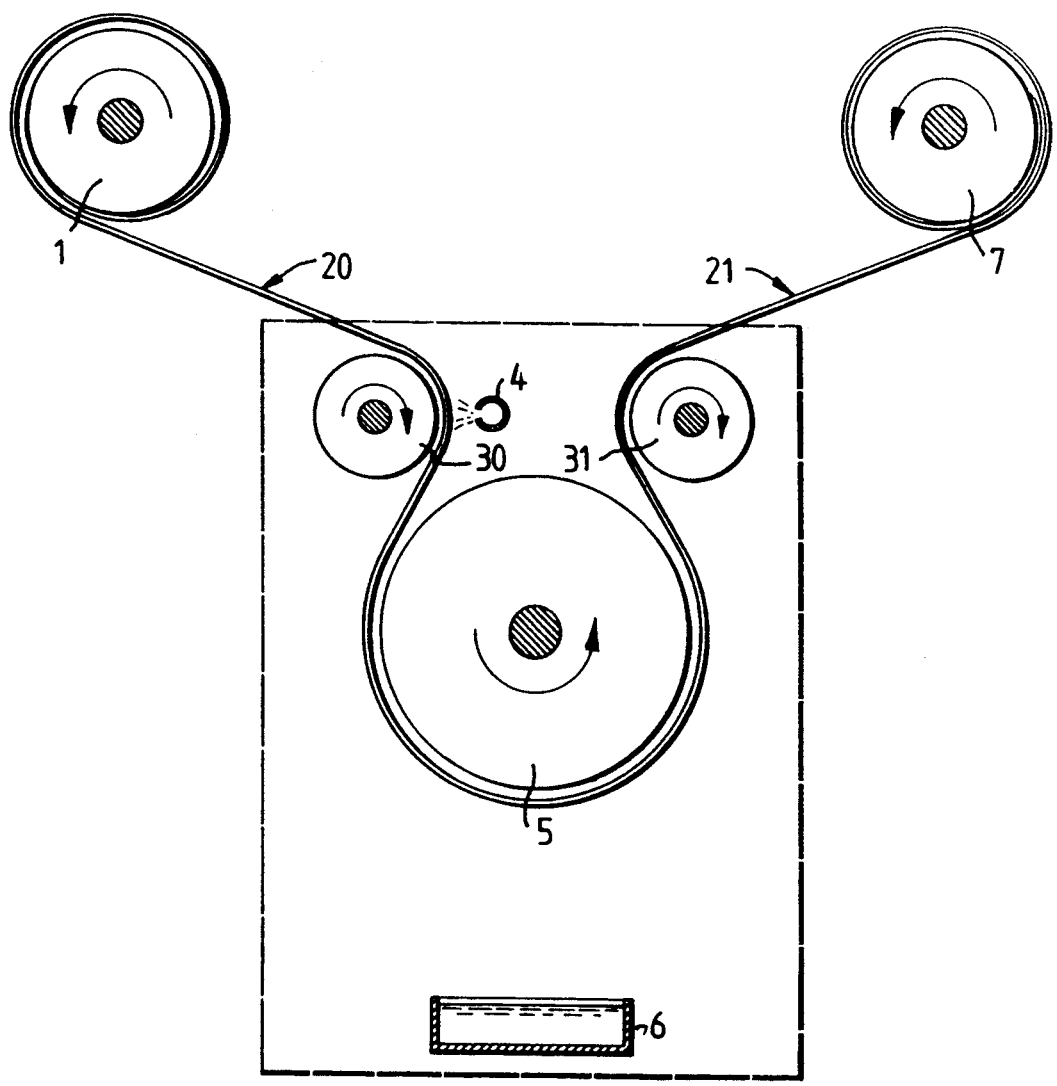
FIG. 1 is a schematic plan of a film coating system.

Referring to FIG. 1, the uncoated film 20 is unwound from the parent roll 1 and passes over a pulley roll 30 under tension around the coating roll 5. The coating roll is chilled with an appropriate refrigerant to about −20° C., so that the film can be chilled on one side. Over an additional pulley roll 31 the film 21 coated by the coating source is wound onto a take-up roll 7. The coating of the film is performed under vacuum conditions by a coating source 6, which is either a thermal evaporation source, a coating source excited by electron bombardment, or a sputtering source.

The wetting unit 4 applies a contact agent, preferably water, to the film surface and is advantageously in the form of a tubular lance which has openings along its longitudinal side through which the contact agent can issue. In FIG. 1 the wetting unit is mounted such that the film surface facing the coating roll can be wetted with the contact agent before coming in contact with the coating roll. For better visualization, in FIG. 1 the film is shown separated slightly from the rolls and rolls 1, 30, 5, 31 and 7. In addition, arrows indicating the sense of rotation are provided on the rolls, indicating the direction in which the film is advanced. The broken lines are intended to show the boundary surfaces of a vacuum chamber within which at least the component groups 4, 5 and 6 are contained.

Figure 2A:
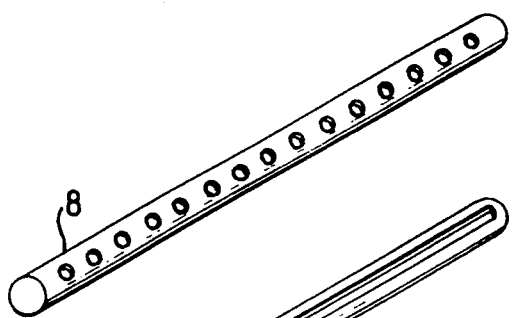
FIGS. 2a, 2b, and 2c show embodiments of the wetting unit.

The tubular wetting units 4 have openings through which the contact agent can reach the film surface. The openings can consist of equally spaced bores 8, shown in FIG. 2a, or of a continuous slot 9 according to FIG. 2b.

Figure 2B:
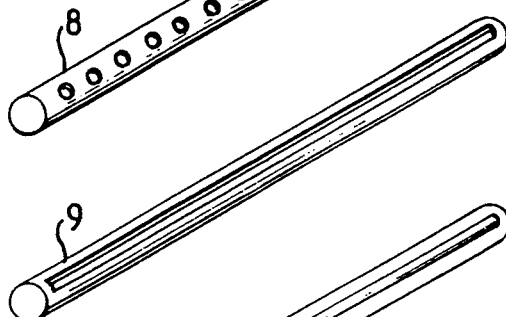

For a more uniform distribution of the contact agent on the film, a sponge-like or felt-like insert 10 is provided, which can be put into the slot 9 of the wetting unit in FIG. 2b. The insert 10 is in contact over its entire length with the film to be wetted. Since the insert is uniformly filled with contact liquid from the inside of the wetting unit, a uniform deposit of contact agent on the film is provided.

Figure 2C:
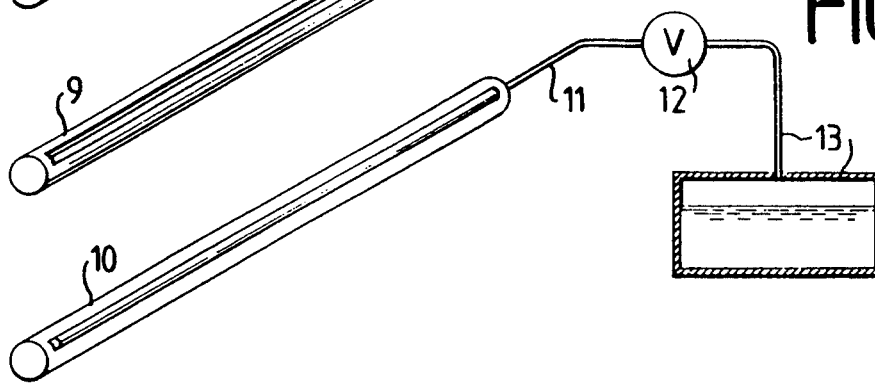

FIG. 2c also shows a feed line 11 for contact agent from a tank 13 in which the contact agent is held. A metering valve 12 is provided in the feed line 11 for better control of the flow.

To control the vapor pressure of the contact agent and, in connection therewith, the contact agent throughput in the feed line 11, the temperature of the contact agent can be adjusted within the supply tank 13 or within the feed line 11.

Preferably, water is used as the contact agent. However, other liquids or gases can be used which have the desired heat transfer coefficients between the coating roll and the film.

I claim:

1. Apparatus for vacuum coating a film having a first surface and an opposed second surface, said apparatus comprising
    a coating roll over which said film is passed with said first surface in contact with said roll,
    pulley means which provide a contact between said first surface and said coating roll,
    a coating source excited by thermalization adjacent said coating roll for coating said second surface of said film, and
    wetting means for providing a liquid contact agent between said first surface and said coating roll prior to passing said film over said coating roll.

2. Apparatus as in claim 1 wherein said wetting means applies said contact agent to said first surface.

3. Apparatus as in claim 1 wherein said wetting means applies said contact agent to said coating roll.

4. Apparatus as in claim 1 wherein said wetting means comprises a tube having orifice means for providing said contact agent on at least one of said roll and said film.

5. Apparatus as in claim 4 wherein said orifice means comprises a linear array of bores in said tube.

6. Apparatus as in claim 4 wherein said orifice means comprises a slot.

7. Apparatus as in claim 1 further comprising
    supply means for said contact agent, and
    a feed line connecting said supply means to said wetting means.

8. Apparatus as in claim 1 further comprising means for controlling the temperature of said contact agent.

9. Apparatus as in claim 1 wherein said wetting means is a tube which is axially parallel to said coating roll and is positioned to wet said first surface of said film.

10. Method for vacuum coating a film having a first surface and an opposed second surface, said method comprising
    guiding said film over a coating roll with said first surface in contact with said roll,
    applying a liquid contact agent on at least one of said first surface of said film and said coating roll prior to passing said film over said coating roll, and
    coating said second surface of said film by thermally exciting a coating source as said film passes over said coating roll under vacuum condition.

11. Method as in claim 10 wherein said liquid contact agent is applied to said first surface of said film.

12. Method as in claim 10 wherein said liquid contact agent is water.

13. Method as in claim 10 wherein said liquid contact agent is applied to said one of said first surface and said coating roll by means of a tube having orifice means.

14. Method as in claim 11 further comprising chilling said coating roll.

15. Method as in claim 14 wherein said coating roll is chilled with a refrigerant.

16. Method as in claim 14 wherein said coating roll is chilled to a temperature of $-20°$ C.

* * * * *